(12) United States Patent
Klaver

(10) Patent No.: US 6,577,400 B1
(45) Date of Patent: Jun. 10, 2003

(54) INTERFEROMETER

(75) Inventor: Renatus Gerardus Klaver, Delft (NL)

(73) Assignee: Stichting Voor de Technische Wetenschappen, Utrecht (NL)

( * ) Notice: Subject to any disclaimer, the term of this patent is extended or adjusted under 35 U.S.C. 154(b) by 0 days.

(21) Appl. No.: 09/719,285

(22) PCT Filed: Jun. 9, 1999

(86) PCT No.: PCT/NL99/00357
§ 371 (c)(1),
(2), (4) Date: Mar. 5, 2001

(87) PCT Pub. No.: WO99/64817
PCT Pub. Date: Dec. 16, 1999

(30) Foreign Application Priority Data

Jun. 10, 1998 (NL) .............................................. 1009366

(51) Int. Cl.$^7$ ................................................. G01B 9/02
(52) U.S. Cl. ...................... 356/477; 356/484; 356/485; 356/489; 356/511; 356/513; 356/515
(58) Field of Search ................................ 356/484, 485, 356/489, 511, 513, 515, 477

(56) References Cited

U.S. PATENT DOCUMENTS

| | | | | |
|---|---|---|---|---|
| 4,536,861 A | * | 8/1985 | Graindorge et al. | 367/149 |
| 4,571,080 A | * | 2/1986 | Popuchon et al. | 356/477 |
| 4,594,003 A | * | 6/1986 | Sommargren | 356/489 |
| 4,818,071 A | * | 4/1989 | Dyott | 356/28.5 |
| 5,570,182 A | * | 10/1996 | Nathel et al. | 356/511 |
| 5,991,034 A | * | 11/1999 | Ohtsuka | 356/511 |
| 6,015,969 A | * | 1/2000 | Nathel et al. | 250/227.27 |
| 6,181,429 B1 | * | 1/2001 | Barberis et al. | 356/477 |
| 6,201,608 B1 | * | 3/2001 | Mandella et al. | 356/491 |

FOREIGN PATENT DOCUMENTS

| | | |
|---|---|---|
| DE | 19522262 A1 | 1/1997 |
| WO | WO 9617221 | 6/1996 |
| WO | WO 9964817 | 12/1999 |

* cited by examiner

Primary Examiner—Robert H. Kim
Assistant Examiner—Allen C Ho
(74) Attorney, Agent, or Firm—Young & Thompson

(57) ABSTRACT

Interferometer for measuring a phase difference between a reference beam (37) and an object beam (36') transformed by an optical element (10), comprising light source means (2), an optical device (3) and detection means (4) in a detection plane (34). The optical device (3) comprises a first light conductor (30) having a first output surface (31) that generates an object beam (36) having a spherical wave front and a second light conductor (32) having a second output surface (33) that generates a reference beam (37) having a spherical wave front, directed onto the detection plane (34), wherein the set-up of the first light conductor (30) and the optical element (10) is such that the transformed object beam (36') interferes with the reference beam (37) in the detection plane (34).

12 Claims, 2 Drawing Sheets

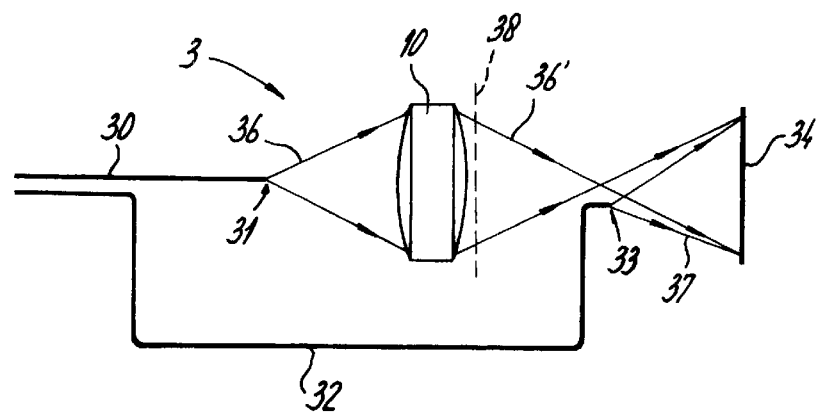
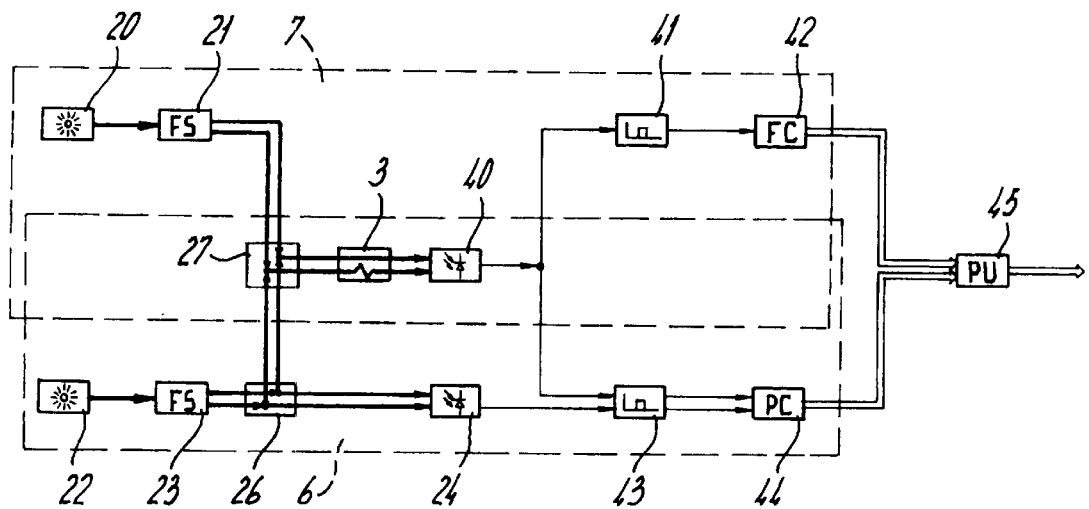

INTERFEROMETER

BACKGROUND OF THE INVENTION

The present invention relates to an interferometer for measuring a phase difference between a reference beam and an object beam transformed by an optical element, comprising light source means, for generating the object beam and the reference beam, an optical device, for allowing the transformed object beam and the reference beam to interfere in a detection plane, and detection means, for detecting the phase difference between wave fronts of the transformed object beam and the reference beam in the detection plane.

An interferometer of this type is disclosed in U.S. Pat. No. 5,076,695. The known interferometer is intended for measuring the surface accuracy of the spherical surface of an object with a high degree of accuracy, without making use of a comparison surface of an accurately known shape. In the past a comparison surface of this type was placed in the position of the spice to be tested, with the aim of calibrating the interferometer. The known interferometer has first optical means for an essentially monochromatic light beam, originating from a light source, along a first optical axis towards a surface to be tested and directing the reflected beam in the opposite direction along the first axis Furthermore, second optical means are present in order to direct the light beam from the light source as a reference beam along a second axis which crosses the first axis and interference means for directing the reflected beam from the surface to be tested towards the second axis in order to interfere with the reference beam. Detection means are arranged on the second axis in order to measure the interference patterns which are produced by interference of the reflected beam and the reference beam. The Interferometer also comprises point diaphragms, arranged at the point of intersection of the first and the second axis to transform the light beam to the surface to be tested and the reference beam directed towards the detection means into spherical waves. The accuracy that is achieved with this known interferometer is between $\lambda/100$ and $\lambda/1000$.

Increasingly more refined techniques are being used for the production of semiconductor chips, the semiconductor structures becoming ever smaller. An extreme ultraviolet (EUV) lithographic technique will probably be used for the production of structures having a resolution of 0.1 $\mu$m, with which technique an optical mask is projected with the aid of a system of mirror as an image reduced in scale onto the substrate on which the structures are produced. The mirrors in this system must be of highly accurate shape in order to obtain the desired effect. The required accuracy of measurement of the shape of the mirrors is approximately 0.1 nm, which at a wavelength of approximately 630 nm (for example an He—Ne laser) corresponds to $\lambda/6300$. The known interferometer for testing a surface is thus insufficiently accurate for this purpose.

SUMMARY OF THE INVENTION

The aim of the present invention is to provide an interferometer which has a very high accuracy compared with the known interferometers.

Said aim is achieved by means of an interferometer of the type defined in the preamble, wherein the optical device comprises:

a first light conductor having an input surface that couples the object beam generated by the light source means into the first light conductor and having a first output surface that generates an object beam having a spherical wave front, a second light conductor having an input surface that couples the reference beam generated by the light source means into the second light conductor and having a second output surface that generates a reference beam having a spherical wave front, the reference beam being directed onto the detection plane, and wherein the arrangement of the first light conductor and the optical element is such that the transformed object beam interferes with the reference beam in the detection plane.

Because the optical device of the interferometer does not contain any optical elements between the location where the spherical wave fronts are generated and the detection plane, except for the optical element that transforms the object beam, the (transformed) object beam and the reference beam are not additionally distorted and the interference between the transformed object beam and the reference beam is very clean. Consequently, in principle, a highly accurate measurement of the phase difference between the beam transformed by the optical element and the reference beam in the detection plane is possible, the accuracy being higher than the mum required accuracy ($\lambda/6300$). Furthermore, the interferometer can be used for both reflecting and transmitting optical elements.

One embodiment of the interferometer according to the present invention further comprises processing means for calculating the phase distribution over a specific cross-section of the transformed object beam on the basis of the phase difference between the wave fronts, the positions of the first and second output surfaces of the first and second light conductors, respectively, the position of the detection plane and the position of the specific cross-section.

With this embodiment of the interferometer it is possible to determine the phase difference with respect to the reference beam in a specific cross-section of the transformed object beam. Because both the object beam and the reference beam have spherical wave fronts, this provides information on the transformation of the object beam by the optical element and thus information on the optical characteristics of the optical element.

In an alternative embodiment of the interferometer according to the present invention, the latter comprises processing means for calculating a spatial plane where the phase difference between the wave fronts has a specific shape on the basis of the phase difference between the wave fronts, the positions of the first and second output surfaces of the first and second light conductors, respectively, the position of the detection plane, the position of the spatial plane in general and of a specific point on the spatial plane. Instead of determining the phase difference in a specific cross-section of the transformed object beam, it is possible, with the aid of this embodiment, to determine a spatial plane on which the phase difference has a specific shape. A particular case of this is a shape of the phase difference for which the phase difference is constant. In this case it is then necessary to determine a position of the spatial plane, as well as a point on said spatial plane that defines the constant phase difference.

In a preferred embodiment of the interferometer according to the present invention, the spatial plane is formed by the surface of a reflecting body. Using the interferometer according to this embodiment it is then possible to determine the precise shape of the reflecting body and specifically to do so as the spatial plane in which the phase difference between the object beam and the transformed object beam is equal to the phase difference that is produced by reflection at the reflecting body. In the case of a reflecting body of dielectric material this phase difference is exactly π. If the reflecting body is not made of dielectric material, the phase rotation is dependent on the angle of incidence of the light beam. The processing means can take this into account. The shape of a reflecting body is also referred to by the term "form figure" or the height z as a function of x and y, which is a dimensionless parameter, which is a measure of the shape or asphericity of the reflecting body.

In a preferred embodiment according to the invention, the said positions are determined by a position determination device which is present in the optical device. An output of the position determination device is connected to the processing means. A laser positioning system is used in order to achieve the required accuracy of position determination.

In a preferred embodiment the light source means and detection means of the interferometer are equipped to detect the phase difference between the wave fronts of the reference beam and the transformed object beam with the aid of a combination of heterodyne phase detection means, which determine the phase difference modulo 2π, and frequency modulation phase detection means for determining the phase difference in multiples of 2π, the two techniques being employed independently and simultaneously by frequency multiplexing of the light source means.

These two techniques in combination ensure that the optical path difference at a detection point can be determined with sufficient accuracy (the accuracy of heterodyne phase detection techniques is of the order of magnitude of λ/10,000) and over the desired range of the optical path difference. As a result of the frequency multiplexing of the source means, the two techniques can be performed independently and simultaneously, as a result of which no errors can be introduced by time-shifted measurement of the phase difference modulo 2π, and the phase difference div 2π.

Preferably, the interferometer according to the invention is equipped such that the detection means comprise at least one photodetector which is positioned in the detection plane, and that the heterodyne phase detection means comprise a frequency-stabilised light source, a first frequency shift device, connected to the output of the frequency-stabilised light source, to supply two light beams offset by a first frequency difference, a reference photodetector, connected to the outputs of the first frequency shift device and, for each photodetector, a first tuner unit connected to the output of the at least one photodetector and the output of the reference photodetector and a phase comparison unit which is connected to the output of the first tuner unit.

Because use is made of heterodyne technology, the bandwidth of the at least one photodetector must be greater than 1 kHz. Consequently, CCD detectors cannot be used and the total number of photodetectors is restricted. Furthermore, an He—Ne laser is for the frequency-stabilised light source because of the good stability and the suitable wavelength.

Furthermore, in a preferred embodiment the interferometer according to the present invention is so equipped that the frequency modulation phase detection means comprise a tunable light source and a second frequency shift device, connected to the output of the tunable light source, to supply two light beams offset by a second frequency difference, the second frequency difference differing from the first frequency difference, and, for each photodetector, an associated second tuner unit, connected to the output of the at least one photodetector, and a frequency counter which is connected to the output of the second tuner unit.

The tunable light source used is preferably a semiconductor laser having an external cavity. With the aid of the external cavity it is possible to the wavelength of the light beams without changing the amplitude. The external cavity also ensures that the coherence length of the light beam is sufficiently great, so that a sufficiently large measurement range for the FM phase measuring technique is obtained. By allowing the second and first frequency difference of the second and first frequency shift device, respectively, to differ, the frequency multiplexing which has already been mentioned is made possible.

Because the interferometer also comprises a phase determination unit for each photodetector, which phase determination unit is connected to the output of the frequency counter and the output of the phase comparator, it is possible to determine the optical path difference, expressed as the phase difference between the wave fronts of the transformed object beam and the reference beam.

In one embodiment of the interferometer according to the invention, the detection means comprise an array of at least ten by at least ten photodetectors. Because the phase difference between the wave fronts of the transformed object beam and the reference beam is determined for all these photodetectors, the shape or asphericity of the reflecting body can be calculated with an adequate spatial frequency in the processing means.

In one embodiment of the interferometer according to the present invention the light source means further comprise an optical delay device for the reference beam before the latter is directed towards the optical device. As a result of the additional optical delay of the reference beam, the optical path difference between them reference beam and the object beam is reduced, as a result of which the required measurement range of the phase detection means (in particular the FM phase detection means) can be smaller.

In a further embodiment of the interferometer according to the invention the light conductors are of essentially the same length. By this means the sensitivity to mechanical and acoustic vibrations, thermal gradients and dispersion effects is reduced, which yields a more accurate and more reliable result.

BRIEF DESCRIPTION OF THE DRAWINGS

The interferometer according to the present invention will now he described in more detail on the basis of a preferred embodiment of the invention with reference to the appended drawings, in which:

FIG. 1 shows a diagrammatic view of the optical system of the interferometer according to the present invention;

FIG. 3 is a schematic representation of the sub-system of a preferred embodiment of the interferometer according to the invention, which measure the phase difference between the reference beam and the transformed object beam in a photodetector in the detection plane.

DETAILED DESCRIPTION OF THE PREFERRED EMBODIMENTS

Figure 2:
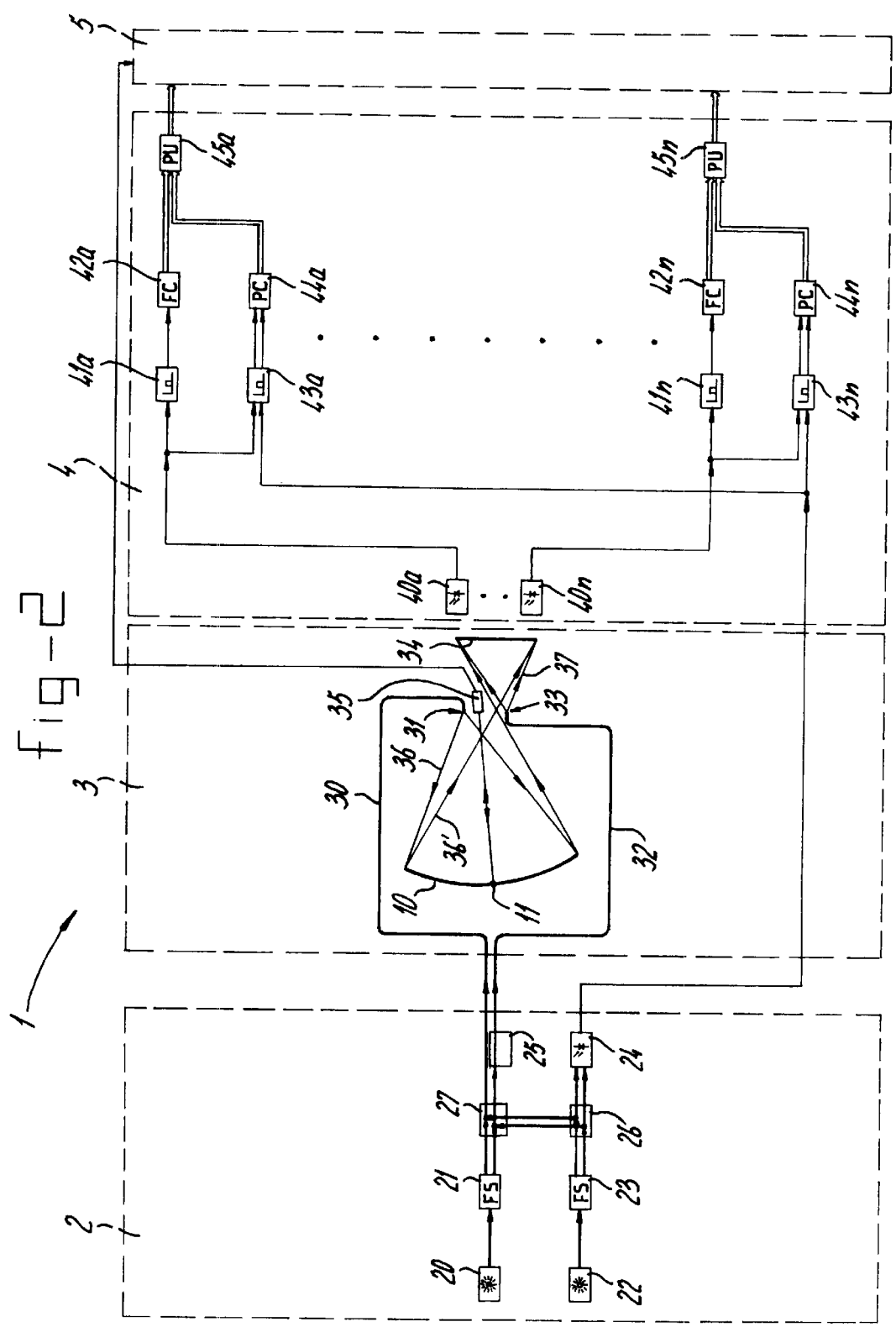
FIG. 2 shows a schematic diagram of a preferred embodiment of the interferometer according to the present invention.

FIG. 1 shows a diagrammatic view of an optical system 3 that forms part of the interferometer 1 according to the present invention. The optical system comprises a first light conductor 30 having a first output surface 31 that generates an object beam 36 having a spherical wave front and a second light conductor 32 having a second output surface 33 that generates a reference beam 37 having a spherical wave front, directed onto the detection plane 34. The first light conductor 30 is at the optical element 10, so that the optical element 10 transforms the spherical object beam 36 in such a way that the transformed object beam 36' interferes with the reference beam 37 in the detection plane 34 In one embodiment of the invention the interferometer 1 comprises processing means (see below) for determining the phase difference between the transformed object beam 36' and the reference beam in a cross-section 38 of the transformed object beam 36'. Because both the object beam 36 and the reference beam 37 have spherical wave fronts, this provides information with regard to the transformation of the object beam 36 by the optical element 10 and thus information with regard to the optical characteristics of the optical element 10.

The interferometer 1 is suitable for both a transmitting and a reflecting optical element 10. An alterative arrangement of the first light conductor 30 and a reflecting optical element 10 in the optical system 3 is below With reference to FIG. 2.

FIG. 2 shows a diagram of a preferred embodiment of the interferometer 1 according to the present invention. The interferometer 1 consists of four sub-systems, i.e. light source means 2, the optical device 3, detection means 4 and processing means 5.

The light source means 2 comprises a frequency-stabilised light source 22, the output of which is connected via a light conductor to a first frequency shift device 23. The light source means 2 further comprise a tunable light source 20, the output of which is connected via a light conductor to the input of a second frequency shift device 21. Two output conductors from the first frequency shift device 23 are connected via a beam splitter 26 both, to a reference photodetector 24 and to the input of a by combination element 27. Two output conductors of the second frequency shift device 21 are also connected to an input of the beam combination element 27. The beam combination element 27 produces an object beam on a first light conductor 30 and a reference beam on a second light conductor 32. In one embodiment of the interferometer according to the invention an optical delay device 25 is inserted in the optical path of the reference beam 32, before the reference beam is conducted into the optical device 3. It is also possible to transfer the various light beams from one element to the next element in the light source means without light conductors (free space transfer).

The first light conductor 30 has a first output surface 31 that generates a spherical wave front, directed onto a reflecting body 10. The second light conductor 32 has a second output surface 33 that generates a spherical wave front, directed onto a detection plane 34. The optical device 3 comprises a position determination device 35 for determining the position of the output surfaces 31 and 33, respectively, of the light conductors 30 and 32, respectively, of the detection plane 34 of the reflecting body 10 in general and of a specific point 11 on the surface of the reflecting body 10.

An object beam 36 having a spherical wave front exits from the output surface 31 of the first light conductor 30. Following reflection at the reflecting body 10, the transformed object beam 36' is produced, which interferes with the reference beam 37 having a spherical wave front, which exits from the output surface 33 of the second light conductor 32, in the detection plane 34.

The detection means 4 comprise a number of photodetectors $40a \ldots 40n$. In a preferred embodiment the detection means 4 are provided with a hundred photodetectors in an array of ten by ten photodetectors $40a \ldots 40n$.

For each photodetector $40a \ldots 40n$ the detection means 4 comprise a first tuner unit $43a \ldots 43n$, which is connected to the output of the respective photodetector $40a \ldots 40n$ and to the output of the reference photodetector 24. Furthermore, the detection means 4 comprise a phase comparison unit $44a \ldots 44n$ for each first tuner unit $43a \ldots 43n$, which phase comparison unit $44a \ldots 44n$ is connected to the output of the respective first tuner unit $43a \ldots 43n$. The detection means 4 also comprise a second tuner unit $41a \ldots 41n$ for each photodetector $40a \ldots 40n$, which second tuner unit $41a \ldots 41n$ is connected to the output of the respective photodetector $40a \ldots 40n$ and a frequency counter $42a \ldots 42n$ which is connected to the output of the respective second tuner unit $41a \ldots 41n$. Finally, the detection means 4 comprise a phase determination unit $45a \ldots 45n$ for each photodetector $40a \ldots 40n$, which phase determination unit $45a \ldots 45n$ is connected to the output of the respective frequency counter $42a \ldots 42n$ and the output of the respective phase comparator $44a \ldots 44n$.

The processing means 5 are connected to the outputs of the phase determination units $45a \ldots 45n$ and to the output of the position determination device 35.

The mode of operation of the interferometer 1 for determination of the shape of a reflecting body 10 will now be explained.

The object beam and the reference beam are conducted in the optical device 3 by the first light conductor 30 and, respectively, second light conductor 32 to respective output surfaces 31, 33. The light conductors 30, 32 are preferably glass fibres, the output surfaces 31, 33 of which act as point diaphragms, as a result of which the beam which exits from the output surface 31, 33 has a substantially spherical wave front. It has been demonstrated that in the far field said wave fronts have a deviation from the spherical of less than $\lambda/10000$. In the optical device 3 the output surface 33 of the second light conductor 32 generates a reference beam 37 having a spherical wave front, directed towards the detection plane 34. In the same way the output surface 31 of the first light conductor 30 generates an object beam 36 having a spherical wave front, but directed onto the reflecting body 10. Following reflection at the reflecting body 10, the transformed object beam 36' is produced in the direction of the detection plane 34. The reference beam 37 and transformed object beam 36' interfere in the detection plane 34.

The beams 36, 36', 37 propagate feely through the space and are not deflected by optical aids or projection devices as in the known device in order to interfere in the detection plane 34. As a result the interferometer under consideration is also referred to as a non-imaging interferometer. Because the optical device 3 of the interferometer 1 contains no optical elements between the location where the spherical wave fronts are generated and the detection plane 34, except for the reflecting body 10, the shape or asphericity of which has to be determined, the object beams 36, 36' and the reference beam 37 are not distorted and the interference between the transformed object beam 36' and the reference beam 37 is very clean. As a result, in principle a highly accurate measurement of the shape of the reflecting body 10 is possible.

Preferably, the light conductors 30, 32 are of the same length in order to reduce the sensitivity to mechanical and acoustic vibrations, thermal gradients and dispersion effects.

A calculation method and a number of data as input for the calculation method are required for determination of the shape of the reflecting body. The data are the phase difference between the transformed object beam 36' and the reference beam 37 in the detection plane 34, the amplitude of the transformed object beam 36' in the detection plane 34 and a model for the optical device 3. The model contains data relating to the positions of the ends 31, 33 of the light conductors 30, 32, of the detection plane 34, of the reflecting body 10 in general and of a specific point 11 on the surface of the reflecting body 10. The position determination device 35 is used to determined the positions in the optical device 3.

A number of specifications which relate to the range offset, the range and the accuracy of the phase measurement have to be set up in order to measure the phase difference. As a result of the set-up of the optical device 3, the light that exits from the light conductor 30 for the object beam has to cover a greater distance before it reaches the detection plane 34 than does the light that exits from the light conductor 32 for the reference beam. The average optical path difference, OPD, in the detection plane 34 is twice the radius of curvature of the reflecting body 10.

In one embodiment of the interferometer 1 according to the invention an optical delay device 25 is arranged in the light source means 2 in the optical path of the reference beam, as a result of which the optical path of the reference beam is increased and the optical path difference OPD is reduced.

The accuracy required for the phase calculation is determined by the maximum permissible error in the shape or asphericity of the reflecting body that is to by determine and the accuracy of the algorithms of the calculation method. For the application as specified above, the required accuracy in the determination of the shape of the reflecting body 10 is 0.12 nm. The required accuracy in the determination of the optical path difference is therefore set at 0.1 nm.

The required range for the phase measurement is equal to the gradient of the phase difference over the detection plane 34. Said gradient is partly determined by the shape or asphericity of the reflecting body 10, but mainly by the tilting that is introduced by the distance between the output surface 33 of the light conductor 32 for the reference beam and the output surface 31 of the light conductor 30 for the object beam. Said distance must be greater than the radius of the image of the output surface 31 of the light conductor 30 for the object beam in order to prevent the output surface 33 of the light conductor 32 for the reference beam shielding the transformed wave front. Approximations for the application already mentioned above have led to specification of the required of 1 mm for the measurement of the optical path difference.

To determine the shape of the reflecting body 10 it is also necessary to determine the number of detectors 40 in the detection plane 34. The number of detectors 40 determines the spatial frequency rage of the calculated shape of the reflecting body 10. For the time being it is assumed that an array of detectors 40 of ten by ten detectors provides sufficient information for calculation of the shape.

For the sake of simplicity, the determination of the phase difference in one of the photodetectors $40a \ldots 40n$ in the detection plane 34 is now described.

FIG. 3 is a schematic representation of the sub-systems of a preferred embodiment of the interferometer 1 according to the invention, which measure the phase difference between the reference beam 37 and the transformed object beam 36' in a detector 40 in the detection plane 34. In this figure the same reference numerals as in FIG. 1 have been used for corresponding elements. Because the object beam 36 and object beam 36' cover a longer optical path than the reference beam 37 in the optical device 3 in FIG. 1, the optical device 3 can be regarded as a delay line for a specific measurement point in the detection plane 34, as is indicated by reference numeral 3 in FIG. 3.

It has been elected to measure the phase difference using a combination of two phase measurement techniques which are known per se, i.e. heterodyne phase measurement and frequency modulation (FM) phase measurement. The heterodyne technique is used to determine the phase difference modulo $2\pi$ and the FM technique is used to determine the phase difference in multiples of $2\pi$ (phase div $2\pi$). The techniques have been chosen in order to be able to comply with the requirements in respect of accuracy, the average optical path difference and the range of the optical path difference.

In FIG. 3 the sub-system for measuring the phase difference modulo $2\pi$ is indicated by reference numeral 6. The modulo sub-system 6 comprises the frequency-stabilised light source 22, the first frequency shift device 23, the reference photodetector 24, the beam splitter 26 and the beam combination element 27. Said elements form part of the light source means 2 shown in FIG. 2. The modulo sub-system 6 further comprises a first tuner unit 43 and a phase comparator 44, which form part of the detection means 4 shown in FIG. 2.

The div sub-system indicated by reference numeral 7 in FIG. 3 comprises the tunable light source 20, the second frequency shift device 21 and, in common with the modulo sub-system 6, the beam combination element 27. Said elements form part of the light-source means 2 shown in FIG. 1. Furthermore, the div sub-system 7 comprises a second tuner unit 41 and a frequency counter 42, which are shown in FIG. 2 as part of the detection means 4.

The sub-systems 6, 7 also have the optical device 3 and the photodetector 40 in the detection plane 34 in common. In addition, the data originating from the frequency counter 42 and the phase comparator 44 are combined in the phase determination unit 45 to give the phase difference between the transformed object beam 36' and the reference beam 37 at the point in the detection plane 34 where the detector 40 has been placed.

So as to be able to comply with the accuracy requirements, the frequency-stabilised light source 22 of the modulo sub-system 6 is preferably constructed s a frequency-stabilised He—Ne laser. So as to be able to use the heterodyne technique, the bandwidth of the detector 40 must be greater than 1 kHz. As a result the use of a CCD camera, as is often used in known interferometers, is not possible and the total number of photodetectors that can be used will be smaller than the number used in CCD cameras. The mode of operation of the modulo sub-system 6 is as follows. The frequency-stabilised laser 22 supplies a light beam to the first frequency shift device 23, which splits the beam into two light beams having a first frequency difference. This constant frequency difference is the carrier wave frequency for the heterodyne detection of the phase difference. The two beams (reference beam and object beam) are split in two in the beam splitter 26. One of the reference beams and one of the object beams are fed to the reference photodetector 24. Said reference photodetector 24 generates a signal having a different frequency, that is to say the carrier wave frequency that has been introduced by the first frequency shift device 23. The other reference beam and object beam are fed to the optical device 3, where a transmission time difference is produced between these two beams. After having passed through the optical device 3, the two beams impinge on the photodetector 40 in the detection plane 34. The signal from the reference photodetector 24 and the signal firm the photodetector 40 are fed to the first tuner unit 43. By means of frequency demultiplexing, the first tuner unit 43 selects the signal from the photodetector 40 that is generated by the light from the modulo sub-system 6.

Because the signal from the reference photodetector 24 does not contain a component originating from the div sub-system 7, this signal in fact does not have to be fed through the first tuner unit 43. In order to minimise the change in phase difference between the signal from the photodetector 40 and the signal from the reference photodetector 24, the signal from the reference photodetector 24 is nevertheless fed through the first tuner unit 43.

The phase comparator 44 measures the phase difference modulo $2\pi$ between the two signals from the first tuner unit 43. This phase difference is equal to the phase difference between the object beam and reference beam and the digitised value thereof is transmitted to phase determination unit 45.

The tunable light source 20 of the div sub-system 7 is a semiconductor laser, the frequency of which can be modulated by a sinusoidal variation of the injection current. Preferably, the tunable light source 20 is, however, a tunable semiconductor laser with external cavity, with which the frequency can be changed by adapting the external cavity. This has the advantage that it is only the frequency and not also the amplitude that is modulated. A further advantage is that the spectral selectivity of the laser with external cavity is greater than that of a laser without external cavity. Consequently the coherence length is greater and the OPD range can be large. In addition, modulation of the frequency is preferably not sinusoidal but triangular. As a result the mixed frequency is constant (if the optical path difference is constant) for longer periods and the frequency counter 42 can be used to determine the frequency. The frequency counter 42, which operates on the basis of time measurement, can function very accurately and produce the result in digital form, which facilitates further processing. In addition, it is possible to average over the period in which the mixed frequency is constant, by which means undesirable disturbances can be filtered out.

Just as in the case of the modulo sub-system 6, the laser beam of the tunable light source 20 is fed to a frequency shift device 21, which splits the laser beam into two beams (reference beam and object beam) having a constant frequency difference. The frequency difference is used as a carrier wave frequency and differs from the carrier wave frequency that has been introduced by the frequency shift device 23 in the modulo sub-system 6, in order to be able to demultiplex the signal from the photodetectors 40a ... 40n. After the object beam and reference beam have passed through the optical device 3, the interference signal of the two is detected by the photodetectors 40a ... 40n. The intensity of the interfering beams, and thus the detector signal, varies with the mixed frequency, which is dependent on the delay in the object beam, caused by the optical path difference. The mixed frequency is determined with the aid of a frequency counter 42. The phase difference in multiples of $2\pi$ is calculated from this frequency, the gradient of the triangular wave shape of the frequency modulation and the frequency difference introduced by the frequency shift device 23 and is transmitted in digital form to the phase determination unit 45.

The phase determination unit 45 combines, per photodetector 40, the signal from the associated frequency counter 42 and phase comparator 44 to give the phase difference between the transformed object beam 36' and the reference beam 37 at the point of the photodetector 40 in the detection plane 34 and transmits this phase difference to the processing means 5.

As frequency shifters 21, 23, various components, as known to the person skilled in the art may be used, such as crystal acousto-optical modulators (AOM), liquid AOM's and rotating gratings. All these components introduce a frequency shift with the help of the Doppler effect. Crystal AOM's are preferred due to their low phase noise. In this application, preferably, an AOM driven at 32 MHz is used for the heterodyne technique (frequency shifter 23) and one driven at 35 MHz is used for the frequency modulation technique (frequency shifter 21).

By using AOM's at the indicated frequencies, requirements are introduced for the phase comparators 44 and frequency counters 42. The required optical path difference accuracy for the heterodyne technique is 0.1 nm at a wavelength of 632.8 nm, leading to a required accuracy for the phase difference of 1 mrad. At a frequency of 32 MHz of the AOM, such a phase difference corresponds to a delay of 5 ps. If the phase difference is measured by determining the time interval between zero crossings of the signals from the object and reference photodetectors (which is the most accurate method), then the required accuracy for the time interval measurement is 5 ps. Currently, there is no interval counter available with an accuracy that meet this requirement. For the div sub system 7 (FM-technique), the required optical path difference accuracy 0.3 $\mu$m. If the laser (tunable light source 20) is modulated with a modulation frequency of 50 Hz and a modulation depth of 70 GHz, this accuracy corresponds to a frequency accuracy of 7 mHz. For frequency measurements using the frequency counters 42, the accuracy is mainly limited by the gate time, i.e. the time in which the frequency can be measured. In this case, the gate time is 10 ms, due to the modulation frequency of 50 Hz. Known frequency counters have a relative resolution of 11 digits for a 1 s gate time. This corresponds to an absolute resolution of 35 mHz for a frequency of 35 MHz of the AOM and a gate time of 10 ms.

These problems may be circumvented by mixing the RF carrier frequencies of 32 MHz and 35 MHz respectively down to IF carrier frequencies of, for example, 1 kHz and 2 kHz At 1 kHz, the required phase difference accuracy of 1 mrad corresponds to a time interval accuracy of 160 ns, which can be reached by using currently known time interval counters. The absolute frequency accuracy of 7 mHz with a gate time of 10 ms at a carrier of 2 kHz can also be reached with a currently known frequency counter.

As known to the person skilled in the art, various alternatives exist for down mixing of the RF frequencies to IF frequencies. A first possibility is to mix the detector signs with signals of 32.001 MHz and 35.002 MHz, respectively in the first and second tuning units 43, 41, respectively.

A further possibility is to reduce the frequency difference between the reference and object beams at the frequency shifters 21, 23. This can be accomplished by using a combination of two AOM's as frequency shifters 21, 23, instead of only one AOM. The two AOM's can be used in series or parallel. One AOM produces a zeroth order and a first order beam, which are used as object and reference beams (with frequency $f_0$ and $f_0+f_1$, respectively). When two AOM's are connected in series, four beams ($f_0+f_1$, $f_0+f_2$, $f_0+f_1-f_2$, $f_0$) are produced, of which the first pair or the second pair may be used as object and reference beam. In both cases, the frequency difference is equal to frequency difference of the AOM driver signals with frequencies $f_1$ and $f_2$. In the case of AOM's connected in parallel, both first order beams may be used with frequencies $f_0+f_1$, $f_0+f_2$, the frequency difference being equal to the frequency difference of the AOM driver signals with frequencies $f_1$ and $f_2$. As a consequence, the detector signals can directly be fed into the phase comparators 44 and into the frequency counters 42.

For both the options of mixing the detector signals with RF signals and the option including two AOM's per frequency shifter 21, 23, two RF frequency signals have to be generated, with a frequency difference equal to the if frequency, in such a way that that the phase noise of the resulting IF frequency signal is low enough to reach the required time interval accuracy of 160 ns and the absolute frequency accuracy of 7 mHz. This requirement can be met by synthesising the two pairs of signals with frequencies $f_1$, $f_2$ of 32.000 and 32.001 Mhz, and 35.000 and 35.002 MHz, respectively, by using four direct digital synthesisers (DDS). For each pair of RF signals $f_1$, $f_2$, the same clock signal is used for the DDS's. Preferably, the clock signals are generated by two low phase noise quartz oscillators, tuned to 125 MHz. By using DDS's to synthesise the signals, the phase noise of the synthesised HF signals is very low. In the ideal case the phase noise for the two RF signals $f_1$, $f_2$ is equal to the phase noise of the clock signal. By using tile same clock signal for the two RF signals $f_1$, $f_2$, the phase noise of both signals is correlated and the phase noise of these signals will cancel each other at the mixing stage, provided that the delay between the generation by the DDS and the mixing stage is substantially the same for both signals.

In the processing means 5 the shape or asphericity of the reflecting body 10 is calculated on the basis of the phase differences which have been determined by the array of photodetectors 40a . . . 40n, with the aid of a numerical inverse propagation algorithm. The premise here is that the phase shift between the wave front of the object beam and the wave front of the transformed object beam that is introduced by the surface of the reflecting body 10 is equal to $\pi$ over the entire surface. This is the case if the reflecting body consists of a dielectric material. If this is not the case, the phase shift at the reflecting body 10 will be dependent on the angle of incidence of the beam at each position on the reflecting body. The algorithm used by the processing means 5 can, of course, be adapted to this. The determination of the shape of the reflecting body 10 is in both cases reduced to the determination of the surface where the phase shift between the object beam and the transformed object beam displays a specific shape and in the case of dielectric material is precisely equal to $\pi$. To facilitate the search for this surface, the position of a specific point 11 on the surface of the reflecting body 10 is determined with the aid of the position determination device 35. The phase of the wave front of the object beam 36, which is assumed to be spherical, in the vicinity of the reflecting body 10 can be calculated on the basis of the position of the output surface 31 of the first light conductor 30, which is determined by the position determination device 35. The calculation of the wave front of the transformed object beam 36' in the vicinity of the reflecting body 10 comprises various steps. First of all the phase of the wave front of the reference beam 37, which is also assumed to be spherical, is calculated in the detection plane 34 on the basis of the position of the output surface 33 of the second light conductor 32, which has been determined by the position determination device 35. The phase of the transformed object beam 36' is then calculated by subtracting the measured phase difference of the phase of the wave front of the reference beam 37 in the detection plane 34. On the basis of this phase of the wave front of the transformed object beam 36' in the detection plane 34, the phase of the wave front of the transformed object beam 36' in the vicinity of the reflecting body 10 is then calculated with the aid of the Fresnell-Kirchhoff diffraction integral. This is of no further importance for the present invention and will therefore not be developed in more detail.

What is claimed is:

1. Interferometer for measuring a phase difference between a reference beam and an object beam transformed by an optical element, comprising:

light source means, for generating the object beam and the reference beam, an optical device, for allowing the transformed object beam and the reference beam to interfere in a detection plane, and detection means, for detecting the phase difference between wave fronts of the transformed object beam and the reference beam in the detection plane, wherein the optical device comprises:

a first light conductor having an input surface that couples the object beam generated by the light source means into the first light conductor and having a first output surface that generates an object beam having a spherical wave front, a second light conductor having an input surface that couples the reference beam generated by the light source means into the second light conductor and having a second output surface that generates a reference beam having a spherical wave front, the reference beam being directed onto the detection plane, and wherein the arrangement of the first light conductor and the optical element is such that the transformed object beam directly interferes with the reference beam in the detection plane.

2. Interferometer according to claim 1, wherein the interferometer further comprises processing means for calculating the phase distribution over a specific cross-section of the transformed object beam on the basis of the phase difference between the wave fronts, the positions of the first and second output surfaces of the first and second light conductors, respectively, the position of the detection plane and the position of the specific cross-section.

3. Interferometer according to claim 1, wherein the detection means comprise an array of at least ten by at least ten photodetectors.

4. Interferometer according to claim 1, wherein the light source means further comprise an optical delay device for the reference beam, before the latter is fed to the optical device.

5. Interferometer according to claim 1, wherein the light conductors are of essentially the same length.

6. Interferometer for measuring a phase difference between a reference beam and an object beam transformed by an optical element, comprising:

light source means, for generating the object beam and the reference beam, an optical device, for allowing the transformed object beam and the reference beam to interfere in a detection plane, and detection means, for detecting the phase difference between wave fronts of the transformed object beam and the reference beam in the detection plane, wherein the optical device comprises:
- a first light conductor having an input surface that couples the object beam generated by the light source means into the first light conductor and having a first output surface that generates an object beam having a spherical wave front,
- a second light conductor having an input surface that couples the reference beam generated by the light source means into the second light conductor and having a second output surface that generates a reference beam having a spherical wave front, the reference beam being directed onto the detection plane, and wherein the arrangement of the first light conductor and the optical element is such that the transformed object beam interferes with the reference beam in the detection plane, and wherein the light source means and detection means are equipped to detect the phase difference between the wave fronts of the reference beam and the transformed object beam with the aid of a combination of heterodyne phase detection means, which determine the phase difference modulo $2\pi$, and frequency modulation phase detection means for determining the phase difference in multiples of $2\pi$, the two techniques being employed independently and simultaneously by frequency multiplexing of the light source means.

7. Interferometer according to claim 6, wherein the detection means comprise at least one photodetector which is positioned in the detection plane, and in that the heterodyne phase detection means comprise:

a frequency-stabilised light source;

a first frequency shift device connected to the output of the frequency-stabilised light source, to produce two light beams offset by a first frequency difference;

a reference photodetector, connected to the outputs of the first frequency shift device and, for each photodetector:
- a first tuner unit connected to the output of the at least one detector and the output of the reference photodetector; and
- a phase comparison unit which is connected to the output of the first tuner unit.

8. Interferometer according to claim 7, wherein the frequency modulation phase detection means comprise:

a tunable light source; and a second frequency shift device, connected to the output of the tunable light source, to produce two light beams offset by a second frequency difference, the second frequency difference differing from the first frequency difference; and, for each photodetector:
- an associated second tuner unit, connected to the output of the at least one photodetector; and
- a frequency counter which is connected to the output of the second tuner unit.

9. Interferometer according to claim 8, wherein the interferometer further comprises, for each photodetector, a phase determination unit, which is connected to the output of the frequency counter and the output of the phase comparator, to determine the phase difference between the wave fronts of the transformed object beam and the reference beam.

10. Interferometer for measuring a phase difference between a reference beam and an object beam transformed by an optical element, comprising:

light source means, for generating the object beam and the reference beam, an optical device, for allowing the transformed object beam and the reference beam to interfere in a detection plane, and detection means, for detecting the phase difference between wave fronts of the transformed object beam and the reference beam in the detection plane, wherein the optical device comprises:
- a first light conductor having an input surface that couples the object beam generated by the light source means into the first light conductor and having a first output surface that generates an object beam having a spherical wave front,
- a second light conductor having an input surface that couples the reference beam generated by the light source means into the second light conductor and having a second output surface that generates a reference beam having a spherical wave front, the reference beam being directed onto the detection plane, and wherein the arrangement of the first light conductor and the optical element is such that the transformed object beam interferes with the reference beam in the detection plane, and wherein the interferometer further comprises processing means for calculating a spatial plane where the phase difference between the wave fronts has a specific shape on the basis of the phase difference between the wave fronts, the positions of the first and second output surfaces of the first and second light conductors, respectively, the position of the detection plane, the position of the spatial plane in general and of a specific point on the spatial plane having the constant phase difference.

11. Interferometer according to claim 10, wherein the spatial plane is formed by the surface of a reflecting body.

12. Interferometer according to claim 11, wherein the optical device further comprises a position determination device, an output of which is connected to the processing means, for determining the position of the first and second output surfaces of the first and second light conductors, of the detection plane, of the reflecting body in general and of the specific point on the surface of the reflecting body.

* * * * *